United States Patent
Cheng et al.

(10) Patent No.: US 10,147,852 B2
(45) Date of Patent: *Dec. 4, 2018

(54) LIGHT-EMITTING DEVICE (71) Applicant: EPISTAR CORPORATION, Hsinchu (TW)

(72) Inventors: Ching-Tai Cheng, Hsinchu (TW); Yih-Hua Renn, Hsinchu (TW); Chun-Hua Shih, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/864,485

(22) Filed: Jan. 8, 2018

(65) Prior Publication Data

US 2018/0151783 A1    May 31, 2018

Related U.S. Application Data

(63) Continuation of application No. 14/959,972, filed on Dec. 4, 2015, now Pat. No. 9,871,174.

(51) Int. Cl.
| | | |
|---|---|---|
| *H01L 33/52* | (2010.01) | |
| *H01L 33/50* | (2010.01) | |
| *H01L 33/58* | (2010.01) | |
| *H01L 33/44* | (2010.01) | |
| *H01L 33/60* | (2010.01) | |
| *H01L 33/62* | (2010.01) | |

(52) U.S. Cl.
CPC ............. *H01L 33/52* (2013.01); *H01L 33/44* (2013.01); *H01L 33/50* (2013.01); *H01L 33/507* (2013.01); *H01L 33/58* (2013.01); *H01L 33/60* (2013.01); *H01L 33/62* (2013.01); *H01L 2933/005* (2013.01); *H01L 2933/0025* (2013.01); *H01L 2933/0041* (2013.01); *H01L 2933/0066* (2013.01); *H01L 2933/0091* (2013.01)

(58) Field of Classification Search
CPC ................................. H01L 33/52; H01L 33/56
See application file for complete search history.

(56) References Cited

U.S. PATENT DOCUMENTS

| | | | |
|---|---|---|---|
| 9,748,461 B2 * | 8/2017 | Tetz | H01L 33/507 |
| 2010/0044731 A1 | 2/2010 | Tokunaga et al. | |
| 2010/0295077 A1 | 11/2010 | Melman | |

(Continued)

OTHER PUBLICATIONS

STIC search dated Jul. 13, 2018.*

(Continued)

*Primary Examiner* — Asok K Sarkar
*Assistant Examiner* — Grant Withers
(74) *Attorney, Agent, or Firm* — Muncy, Geissler, Olds & Lowes, P.C.

(57) ABSTRACT

A light-emitting device includes a light-emitting element, a cover layer, and an anti-adhesion layer. The light-emitting element has a top surface, a bottom surface and a side surface. The cover layer covers the light-emitting element and includes a first transparent binder. The anti-adhesion layer includes a flouro-resin or a fluoride compound and disposed on the cover layer and the top surface as an outermost layer of the light-emitting device. The anti-adhesion layer has a hardness greater than a hardness of the cover layer.

19 Claims, 5 Drawing Sheets

(56) References Cited

U.S. PATENT DOCUMENTS

| | | | |
|---|---|---|---|
| 2012/0132944 A1* | 5/2012 | Hsieh | H01L 33/46 257/98 |
| 2013/0260489 A1 | 10/2013 | Kwon et al. | |
| 2013/0285064 A1 | 10/2013 | Kojima et al. | |
| 2014/0009060 A1 | 1/2014 | Kimura et al. | |
| 2014/0231839 A1 | 8/2014 | Jeon et al. | |

OTHER PUBLICATIONS

K.L. Mittal, "Surface Contamination: Genesis Detection and Control," IBM Corporation, East Fishkill Facility, vol. 1, copyright 1979, p. 95, Plenum Press, New York.

"Guide for the Safe Handling of Fluoropolymer Resins," article by Plastics Europe, published Nov. 2012, pp. 1-24.

ChEBI website page "poly(tetrafluorethylene)(CHEBI:53251)" available online at http://www.ebi.ac.uk/chebi/searchId.do?chebiId=53251 as of May 21, 2013, pp. 1/2-2/2.

Goodfellow material property sheet, "Polytetrafluoroethylene (PTFE) Material Information" available online at www.goodfellow.com/E/Polytetrafluoroethylene.html as of Apr. 5, 2017, pp. 1/4-4/4.

\* cited by examiner

LIGHT-EMITTING DEVICE

REFERENCE TO RELATED APPLICATION

This present application is a continuation patent application of U.S. patent application, Ser. No. 14/959,972, filed on Dec. 4, 2015, and the entire content of which is hereby incorporated by reference.

BACKGROUND

Technical Field

The present disclosure relates to a light-emitting device, and in particular to a light-emitting device with an anti-adhesion treatment.

DESCRIPTION OF THE RELATED ART

Light-emitting diodes (LEDs) are energy efficient, durable, and compact, and have faster response time and longer life span compared with incandescent light bulbs or fluorescent tubes. In general, The LED is packaged by an outer layer for protection. However the outer layer is usually made of resin or other sticky material which can cause problems in handling, such as transferring the LED from one place to another.

SUMMARY OF THE DISCLOSURE

An embodiment of the application discloses a light-emitting device. The light-emitting device includes a light-emitting element, a cover layer, and an anti-adhesion layer. The light-emitting element has a top surface, a bottom surface and a side surface. The cover layer covers the light-emitting element and includes a first transparent binder. The anti-adhesion layer includes a flouro-resin or a fluoride compound and disposed on the cover layer and the top surface as an outermost layer of the light-emitting device. The anti-adhesion layer has a hardness greater than a hardness of the cover layer.

DETAILED DESCRIPTION OF THE EMBODIMENTS

To better and concisely explain the disclosure, the same name or the same reference numerals given or appeared in different paragraphs or figures along the specification should has the same or equivalent meanings while it is once defined anywhere of the disclosure. In addition, these drawings are not necessarily drawn to scale. Likewise, the relative sizes of elements illustrated by the drawings may differ from the relative sizes depicted.

The following shows the description of embodiments of the present disclosure in accompany with the drawings.

Figure 1A:
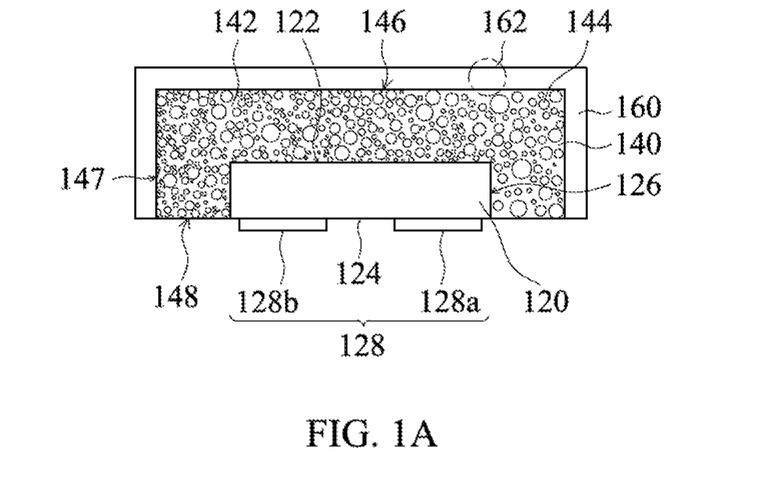
FIG. 1A is a cross sectional view of a light-emitting device in accordance with one embodiment of the present disclosure.
Figure 1B:
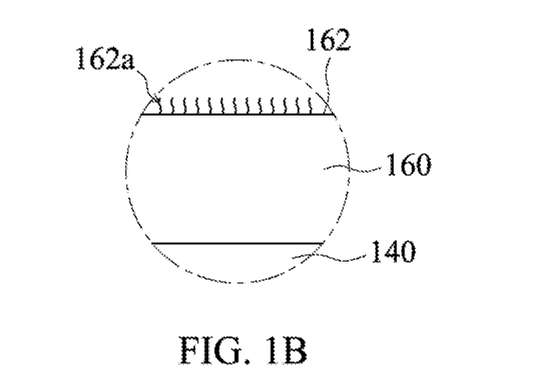
FIG. 1B is an enlarged view of the dashed circle in FIG. 2A.

FIG. 1A is a cross sectional view of a light-emitting device 100 in accordance with one embodiment of the present disclosure. FIG. 1B is an enlarged view of a portion 162 of the light-emitting device 100. Referring to FIG. 1A, the light-emitting device 100 includes a light-emitting element 120, a cover layer 140, and an anti-adhesion layer 160. The cover layer 140 has a transparent resin and a plurality of wavelength conversion particles, and covers the light-emitting element 120. The anti-adhesion layer 160 includes a fluoro-containing material, and is disposed on the cover layer 140.

The light-emitting element 120 includes a top surface 122, a bottom surface 124 opposite to the top surface 122 and a plurality of side surfaces 126 formed between the top surface 122 and the bottom surface 124. The light-emitting element 120 can be a horizontal type LED die with bonding pads arranged on the same side of the LED die. In an embodiment, the light-emitting element 120 includes a light-emitting structure with several layers (not shown) and electrical contacts 128a, 128b disposed on a bottom surface of the light-emitting structure. Electrical contacts 128a, 128b can be both extended to an elevation lower than a bottom surface 148 of a cover layer 140 or to an elevation close to the bottom surface 148 (not shown). In other embodiment, one of electrical contacts 128a, 128b is lower than the bottom surface 148 (not shown), the other one is higher than or flush with the bottom surface. One of the electrical contacts 128a, 128b is connected to an anode of an external power source, and the other is connected to a cathode of the external power source (not shown).

In an embodiment, the light-emitting structure includes a growth substrate, a first semiconductor layer, an active layer and a second semiconductor layer. The light-emitting structure can be activated to generate UV light, blue light, green light, or red light. The light-emitting structure can contain aluminum, arsenic, gallium, indium, nitrogen, phosphorous, or any reasonable combination thereof. The growth substrate can be sapphire, gallium phosphide, gallium nitride, silicon, or silicon carbide. The first semiconductor layer includes an n-type semiconductor layer. The second semiconductor layer contains a p-type semiconductor layer. Moreover, electrical contacts 128a and 128b can be electrically connected to the first semiconductor layer and the second semiconductor layer, respectively.

The light-emitting element 120 can emit a first light mainly from the top surface 122. The light-emitting element 120 can be a laser diode or a light-emitting diode. In one embodiment, the light-emitting element 120 is a blue LED die which can emit a light having a dominant wavelength or a peak wavelength in the range of 430 nm and 490 nm.

The cover layer 140 includes an upper surface 146 on the top surface 122, a bottom surface 148 opposite to the upper surface 146, and a plurality of side surfaces 147 (left and right side surfaces are shown in the drawing, however, front and rear side surfaces are possible) extended from the upper surface 146 to the bottom surface 148. In an embodiment, the cover layer 140 covers the top surface 122 and the side surfaces 124 of the light-emitting element 120.

In an embodiment, the cover layer 140 is a kind of wavelength conversion layer which can convert light out of the light-emitting element 120 to different color light. The wavelength conversion layer can include a transparent binder 142 and a plurality of wavelength conversion particles 144 dispersed within the transparent binder 142. The wavelength conversion particles 144 can absorb light from the light-emitting element 120 to emit another light with different spectrum. In one embodiment, the wavelength conversion particles 144 can emit light having a dominant wavelength or a peak wavelength in the range of 530 nm and 590 nm, e.g. yellow light. In another embodiment, the wavelength conversion particles 144 can emit light having a dominant wavelength or a peak wavelength in the range of 515 nm and 575 nm, e.g. yellowish green light. In another embodiment, the wavelength conversion particles 144 can emit light having a dominant wavelength or a peak wavelength in the range of 590 nm and 650 nm, e.g. red light. In one embodiment, the light from the light-emitting element 120 and the light converted by the wavelength conversion particles 144 can be mixed into a mixed light, e.g. white light.

The wavelength conversion layer can include a single or different kinds of wavelength conversion particles 144. In one embodiment, the wavelength conversion layer contains the wavelength conversion particles 144 capable of emitting yellow light. In another embodiment, the wavelength conversion layer 140 has two kinds of wavelength conversion particles 144 capable of emitting yellowish green light and red light.

As the materials of the wavelength conversion particles 144, inorganic phosphor, organic fluorescent colorant, semiconductor material, or combinations thereof can be used. The semiconductor material includes nanocrystal semiconductor material, such as quantum-dot luminescent material.

The transparent binder 142 can disperse the wavelength conversion particles 144 within a space and fix related positions between the wavelength conversion particles 144. The transparent binder 142 can have a higher transparency to the lights from the light-emitting element 220 and the wavelength conversion particles 244, such as 80%, 90%, 95% or 99% transparency.

The transparent binder 142 can be a thermosetting resin, for example, a silicone resin or an epoxy resin.

The anti-adhesion layer 160 can be disposed on the cover layer 140 and cover the light-emitting element 120 and the cover layer 140. In an embodiment, the anti-adhesion layer 160 covers the upper surface 146 and side surfaces 147 of the cover layer 140.

In one embodiment, an average thickness of the cover layer 140 on the top surface 122 is greater than 90 μm, and an average thickness of the anti-adhesion layer 160 on the top surface 122 is less than 10 μm. In another embodiment, the average thickness of the anti-adhesion layer 160 on the top surface 122 is less than 5 μm. Therefore, a ratio of the average thickness of the cover layer 140 on the top surface 122 to the average thickness of the anti-adhesion layer 160 on the top surface 122 is greater than 9. The average thickness is defined as an average of thicknesses measured in five or more portions. The distance between two adjacent positions is ranged from 10 μm to 50 μm.

Referring to FIG. 1B, a portion of the light-emitting device 200, within the dashed circle in FIG. 1A, is enlarged for magnification purposes. In an embodiment, the anti-adhesion layer 160, located on an outermost layer of the light-emitting device 100, contacts the cover layer 140. The anti-adhesion layer 160 can prevent the cover layer 140 from adhering to other materials. The anti-adhesion layer 160 can be coated on the cover layer 140 or mixed/diffused into the surface of the cover layer 140. The anti-adhesion layer 160 can include a fluoro-containing material. The fluoro-containing material is defined as fluoro-resin or fluoride compound. The fluoro-resin includes fluoro(meth)acrylate, fluoro-silicone resin or fluoro-surfactant. The fluoride compound includes $MgF_2$, $BaF_2$, $SrF_3$, $CaF_2$, KF, NaF, $AlF_3$, $Na_3AlF_6$, $Na_5Al_3F_{14}$. A portion of the fluoro-containing material 162a can be exposed on a surface 162 of the anti-adhesion layer 160. The surface 162 of the anti-adhesion layer 160 is located at a side opposite to the cover layer 140. The fluoro-containing material can provide the light-emitting device 100 with a lower surface energy than the cover layer 140 so as to decrease the strength of the adhesion. In this way, the light-emitting device 100 can avoid a sticking problem when releasing the light-emitting device 100 from a pickup tool, such as a vacuum suction head.

In one embodiment, the light-emitting device 100 is less sticky when the adhesion of its outer surface is lower than 1 N. The method of measuring the value of adhesion is described hereinafter. A test sample is attached to a flat carrier. A flat glass is then put on a top surface of the test sample. The test sample has a dimension of 1.6 mm (length)×1.6 mm (width). The flat glass is given a force that is parallel to the top surface of the test sample to measure the shear strength between the flat glass and the top surface of the test sample. It has to be noted that the value of the shear strength is an absolute value. In another embodiment, the aforementioned measuring method can be applied to two or more test samples to obtain an average adhesion. Specifically, the test samples are selected from a single batch or multiple batches. The test samples are measured according to aforementioned method to obtain their adhesions. The average of the adhesions is the average adhesion.

In one embodiment, the anti-adhesion layer 160 has a hardness greater than the cover layer 140. The anti-adhesion layer 160 with a higher hardness can prevent the pickup tool from being trapped in or stuck by it due to a serious deformation on the surface of the anti-adhesion layer 160.

In one embodiment, the anti-adhesion layer 160 has a refraction index less than 1.40. The anti-adhesion layer 160 can be $MgF_2$, $CaF_2$, KF, NaF, $AlF_3$, $Na_3AlF_6$ or $Na_5Al_3F_{14}$. The refraction index of the anti-adhesion layer 160 is less than the transparent binder 142 of the wavelength conversion layer 140. Material of the transparent 142 can be silicone resin. The gradient from high refraction index to low refraction index is advantage to eliminate total light reflection and can therefore enhance light extraction.

In another embodiment, the anti-adhesion layer 160 can be formed with a rough surface so as to decrease the sticking problem of the light-emitting device. The shape of rough surface can include regular or irregular concave(s) and convex(s). In one embodiment, the rough surface is formed by grinding, blasting, and other roughening method.

Figure 2A:
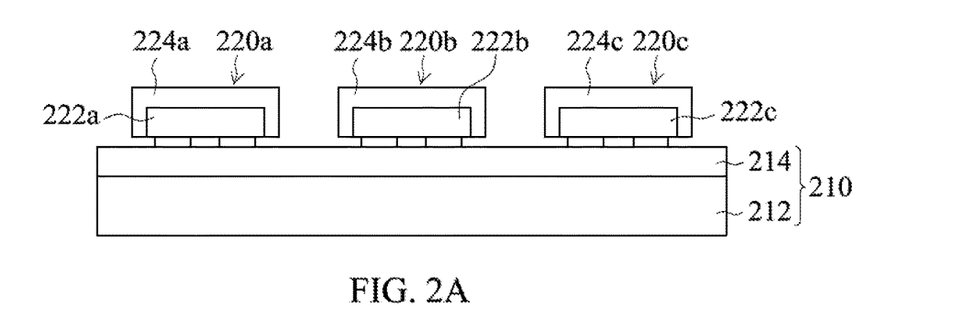
FIGS. 2A~2C illustrate methods of making the light-emitting device in accordance with one embodiment of the present disclosure.
Figure 2B:
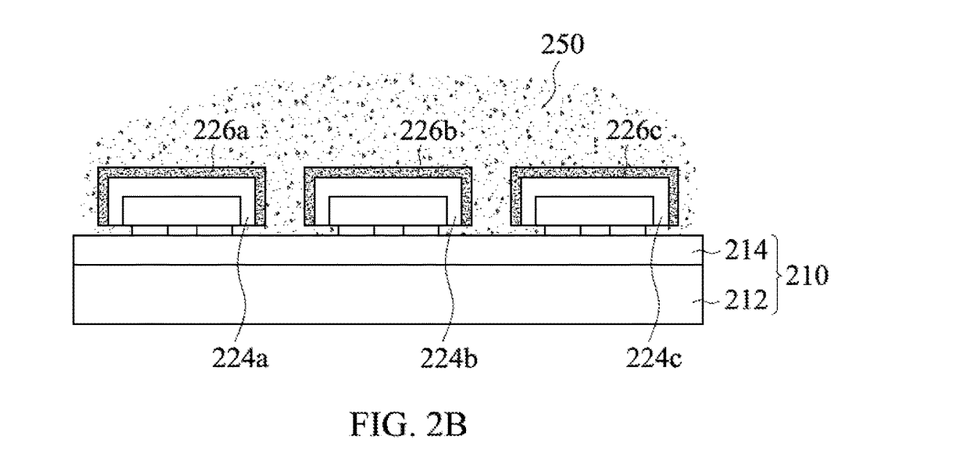
Figure 2C:
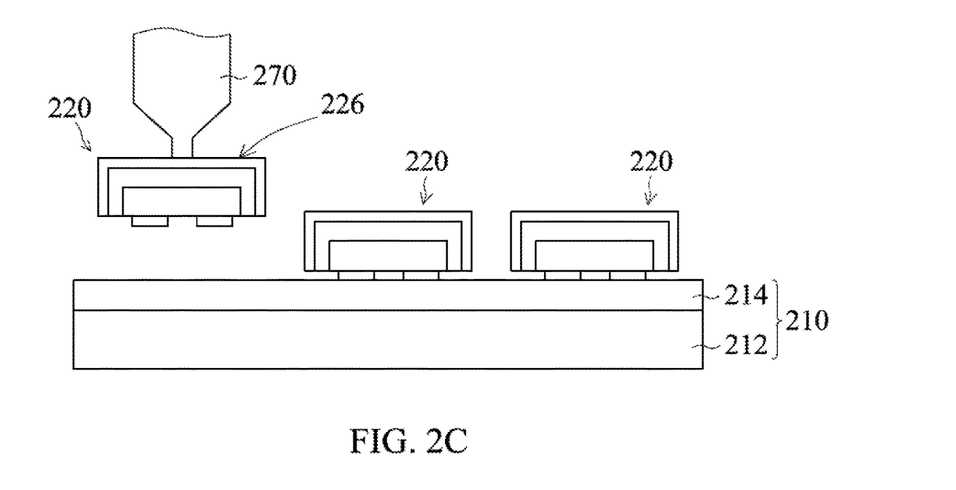

FIGS. 2A~2C illustrate a method of making the light-emitting device 100 of FIG. 1A. Referring to FIG. 2A, a carrier 210 is provided, and a plurality of untreated light-emitting devices, for example, light-emitting devices 220a, 220b and 220c, are disposed on the carrier 210. The untreated light-emitting device is herein defined as a light-emitting device which is not yet permanently integrated with the anti-adhesion layer. In one embodiment, the carrier 210 includes a substrate 212 and an adhesive 214. The substrate 212 can support the untreated light-emitting devices 220a, 220b and 220c, and the adhesive 214 can temporarily connect the untreated light-emitting devices 220a, 220b and 220c with the substrate 212. In one embodiment, the untreated light-emitting device 220a includes a light-emitting element 222a, and a cover layer 224a covering the light-emitting element 222a. The untreated light-emitting device 220b includes a light-emitting element 222b and a cover layer 224b. The untreated light-emitting device 220c includes a light-emitting element 222c and a cover layer 224c.

Referring to FIG. 2B, an anti-adhesion material 250 is applied to outer surfaces of the light-emitting devices 220a, 220b and 220c to form anti-adhesion layers 226a, 226b and 226c. Moreover, the anti-adhesion material 250 can include a fluoro-material. The untreated light-emitting devices 220a, 220b and 220c integrated with the anti-adhesion material 250 are hereinafter numbered as light-emitting devices 220. In one embodiment, the anti-adhesion layer 226a, is formed on the cover layer 224a; similarly, the anti-adhesion layer 226b is formed on the cover layer 224b, and the anti-adhesion layer 226c is formed on the cover layer 224c. The method of applying an anti-adhesion material 250 can include spraying, dipping, coating or sputtering. In one embodiment, the spraying method is adopted using a spraying liquid which includes a fluoro-resin and a solvent. The solvent can be removed at room temperature or a elevating temperature. In other embodiment, a target material used by the sputtering method can be a fluoride compound, such as $CaF_2$.

Referring to FIG. 2C, the light-emitting device 220 is separated from the carrier 210. In one embodiment, the light-emitting device 220 is picked up from the carrier 210 by a pickup tool 270, such as a vacuum suction head. Since the light-emitting device 220 has the anti-adhesion layer 226 formed thereon, the pickup tool 270 can easily release the light-emitting device 220 to a destination without suffering sticky problem.

Figure 3:
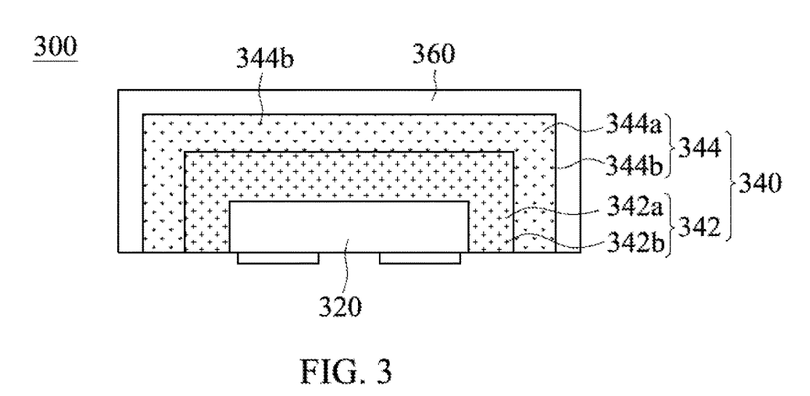
FIG. 3 is a cross sectional view of a light-emitting device in accordance with another embodiment of the present disclosure.

FIG. 3 illustrates a cross sectional view of a light-emitting device 300 in accordance with another embodiment of the present disclosure. The light-emitting device 300 includes a light-emitting element 320, a cover layer 340 covering the light-emitting element 320, and an anti-adhesion layer 360 disposed on the cover layer 340, wherein the cover layer 340 includes a wavelength conversion layer 342 and a light-diffusing layer 344 disposed on the wavelength conversion layer 342. In one embodiment, the wavelength conversion layer 342 includes a transparent binder 3342a and a plurality of wavelength conversion particles 342b dispersed within the transparent binder 342a. In one embodiment, the light-diffusing layer 344 has a transparent binder 344a and a plurality of light-diffusing particles 344b dispersed within the transparent binder 344a. The transparent binder 344a of light-diffusing layer 344 and the transparent binder 342a of the wavelength conversion layer 342 can be composed of identical, similar or different material(s). In one embodiment, the transparent binder 344a of light-diffusing layer 344 and the transparent binder 342a of the wavelength conversion layer 342 both contain silicone resin.

Figure 4:
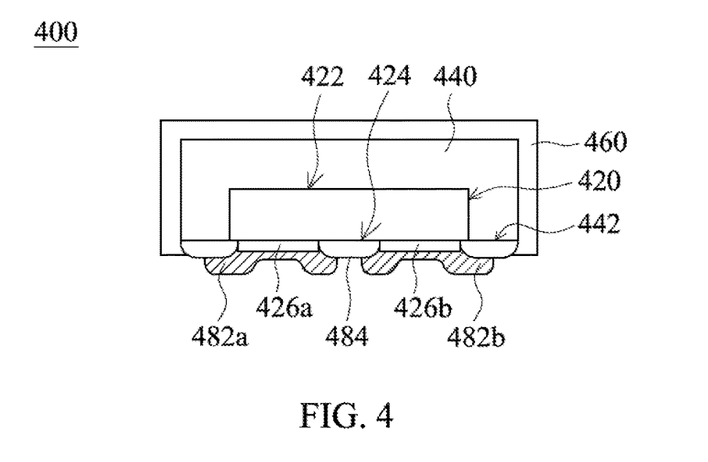
FIG. 4 is a cross sectional view of a light-emitting device in accordance with another embodiment of the present disclosure.

FIG. 4 illustrates a cross sectional view of a light-emitting device 400 in accordance with another embodiment of the present disclosure. The light-emitting device 400 includes a light-emitting element 420, a cover layer 440 covering the light-emitting element 420, and an anti-adhesion layer 460 disposed on the cover layer 440. The light-emitting element 420 has a bottom surface 424. Electrical contacts 426a, 426b are formed on some areas of the bottom surface 424. Moreover, a light reflection layer 484 can be formed on the bottom surface 424 of the light-emitting element 420 and the bottom surface 442 of the cover layer 440, and can sandwich the electrical contacts 526a, 526b from two sides of each electrical contact, as shown in FIG. 4, or surround the electrical contacts 426a, 426b in an elevation view (not shown). In one embodiment, the light reflection layer 484 includes a resin and one or more light reflection materials dispersed within the resin. The resin can be a kind of silicone resin or epoxy resin. The light reflection material can include white pigment, such as titanium oxide. The light reflection layer 484 can be formed on the bottom surface 424 and the bottom surface 442 by a screen printing method. Furthermore, extension electrodes 482a, 482b are formed to cover the electrical contacts 426a, 426b, respectively, and extend to cover portions of the light reflection layer 484. The extension electrodes 482a, 482b can have shapes or contours substantially formed in compliance with profiles of the electrical contacts 426a, 426b and the light reflection layer 484. The extension electrodes 482a, 482b can act as physical and electrical connections between the light-emitting device 400 and an external circuit, such as a PCB board. The extension electrodes 482a, 482b can be formed by a plating process.

Figure 5:
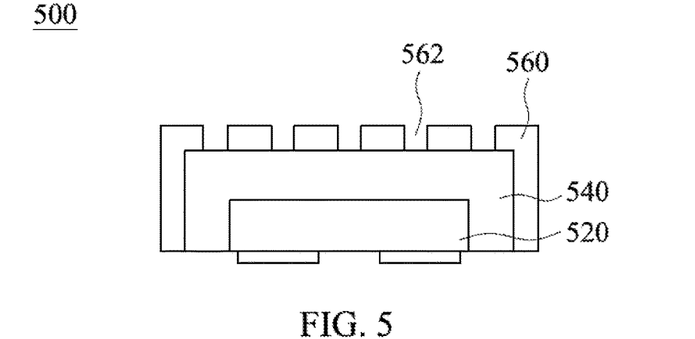
FIG. 5 is a cross sectional view of a light-emitting device in accordance with another embodiment of the present disclosure.

FIG. 5 illustrates a cross sectional view of a light-emitting device 500 in accordance with another embodiment of the present disclosure. The light-emitting device 500 includes a light-emitting element 520, a cover layer 540 covering the light-emitting element 520, and an anti-adhesion layer 560 disposed on the cover layer 540. In one embodiment, the anti-adhesion layer 560 has a rough surface 562, such as a patterned structure. In one embodiment, the patterned structure includes a protruded portion and a recess portion. The recess portion exposes the cover layer 540. However, in another embodiment, the recess portion is not formed to expose the cover layer 540. In other words, the cover layer 540 is completely covered by the patterned structure. The rough surface 562 can reduce the direct contact area between the pickup tool and the light-emitting device 500 so the sticky problem can be relieved. The rough surface 562 of the anti-adhesion layer 500 can be formed by screen printing or lithography.

Figure 6:
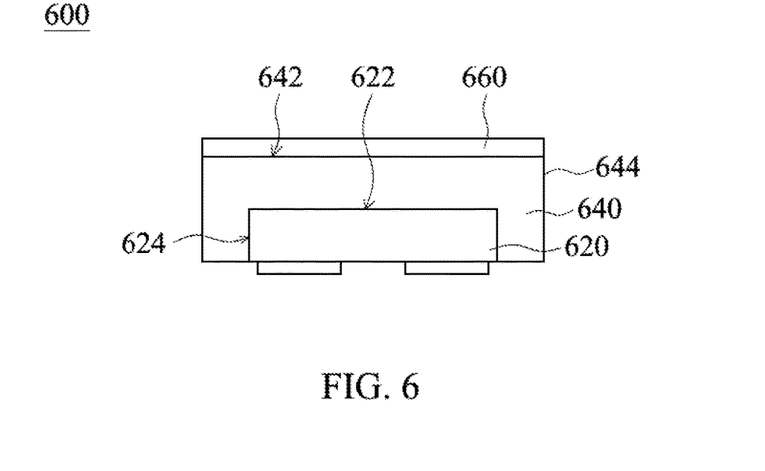
FIG. 6 illustrates is a cross sectional view of a light-emitting device in accordance with another embodiment of the present disclosure.

FIG. 6 illustrates a cross sectional view of a light-emitting device 600 in accordance with another embodiment of the present disclosure. The light-emitting device 600 includes a light-emitting element 620, a cover layer 640 covering the light-emitting element 620, and an anti-adhesion layer 660 disposed on the cover layer 640. In one embodiment, the light-emitting element 620 has a top surface 622 and a side surface 624 surrounding the top surface 622. The cover layer 640 has an upper surface 642 corresponding to the top surface 622, and a side surface 644 corresponding to the side surface 624. The anti-adhesion layer 660 covers the upper surface 642 and exposes the side surface 644 of the cover layer 640.

Figure 7A:
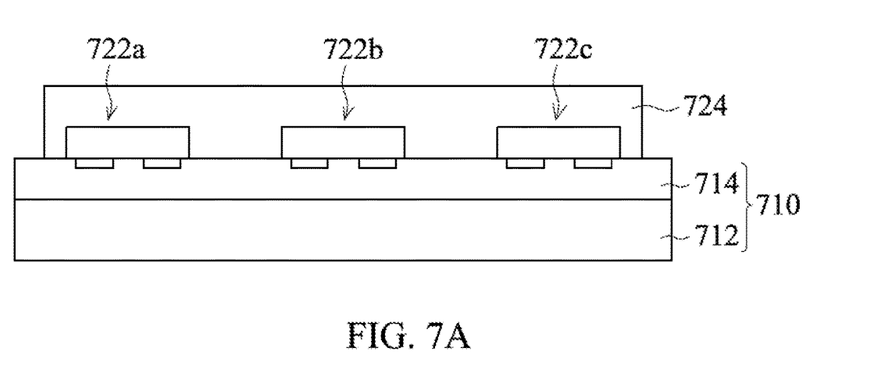
FIGS. 7A~7C illustrate methods making the light-emitting device in accordance with another embodiment of the present disclosure.
Figure 7B:
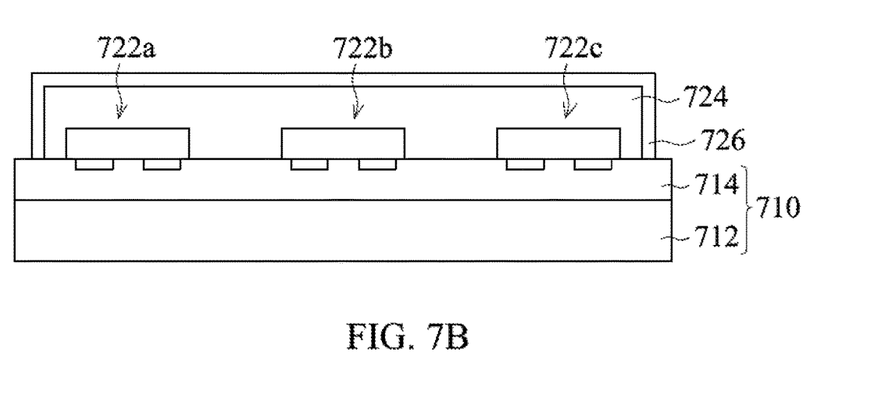
Figure 7C:
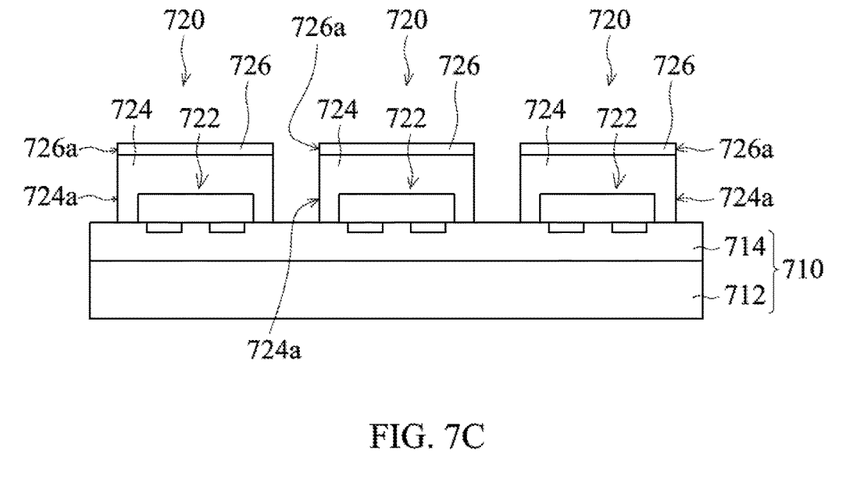

FIGS. 7A~7C illustrate a method of making the light-emitting device 600 of FIG. 6. Referring to FIG. 7A, a carrier 710 is provided. Light-emitting elements 722a, 722b and 722c are disposed on the carrier 710. The light-emitting elements 722a, 722b and 722c are spaced from each other by a gap. In some embodiments, a ratio of a width of the light-emitting element 722a to the gap is ranged from 0.5 to 8. In one embodiment, the carrier 710 includes a substrate 712 and an adhesive 714. The substrate 712 and the adhesive 714 act as the previously described the substrate 212 and the adhesive 214. Moreover, a cover layer 724 covers the light-emitting elements 722a, 722b and 722c. The cover layer 724 is a continuous film when applying to the light-emitting elements 722a, 722b and 722c. In other words, the cover layer 724 can cover or fill the gap between two adjacent light-emitting elements.

Referring to FIG. 7B, an anti-adhesion layer 726 is formed on the cover layer 724. The method of applying the anti-adhesion layer 726 can be referred to the related paragraphs directed to FIG. 2B.

Referring to FIG. 7C, the cover layer 724 and the anti-adhesion layer 726 are divided through gaps between the light-emitting elements 722 to form a plurality of separated light-emitting devices 720. Each of the light-emitting devices 720 exposes a side surface 724a of the cover layer 724. The side surface 724a is substantially coplanar with a side surface 726a of the anti-adhesion layer 726. The cover layer 724 and the anti-adhesion layer 726 can be divided by a blade (not shown).

It is noted that the foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a light-emitting element comprising a top surface, a bottom surface and a side surface arranged between the top surface and the bottom surface;
a cover layer, comprising a first transparent binder and covering the light-emitting element; and
an anti-adhesion layer, comprising a fluoro-resin or a fluoride compound, and disposed on the cover layer and the top surface as an outermost layer of the light-emitting device,
wherein the anti-adhesion layer has a hardness greater than a hardness of the cover layer.

2. The light-emitting device according to claim 1, wherein the light-emitting device has an adhesion less than 1 N.

3. The light-emitting device according to claim 1, wherein the anti-adhesion layer directly contacts the cover layer.

4. The light-emitting device according to claim 1, wherein the fluoro-resin comprises fluoro(meth)acrylate, fluoro-silicone resin or fluoro-surfactant.

5. The light-emitting device according to claim 1, wherein the fluoride compound comprises $MgF_2$, $BaF_2$, $SrF_3$, $CaF_2$, KF, NaF, $AlF_3$, $Na_3AlF_6$ or $Na_5Al_3F_{14}$.

6. The light-emitting device according to claim 1, wherein the anti-adhesion layer has a refraction index less than 1.40.

7. The light-emitting device according to claim 1, wherein the anti-adhesion layer has a refraction index less than that of the first transparent binder.

8. The light-emitting device according to claim 1, wherein an average thickness of the anti-adhesion layer on the top surface is less than 10 μm.

9. The light-emitting device according to claim 1, wherein a ratio of a first average thickness of the cover layer on the top surface to a second average thickness of the anti-adhesion layer on the top surface is greater than 9.

10. The light-emitting device according to claim 1, wherein the cover layer comprises a wavelength conversion layer and a light-diffusing layer disposed on the wavelength conversion layer.

11. The light-emitting device according to claim 10, wherein the light-diffusing layer comprises a second transparent resin and a plurality of light-diffusing particles dispersed within the second transparent resin.

12. The light-emitting device according to claim 1, wherein the cover layer covers the top surface, the bottom surface and the side surface.

13. The light-emitting device according to claim 1, further comprising a plurality of electrical contacts directly contacting the bottom surface.

14. The light-emitting device according to claim 13, further comprising a light reflection layer surrounding each of the plurality of electrical contacts.

15. The light-emitting device according to claim 14, further comprising a plurality of extension electrodes covering the electrical contacts and a portion of the light reflection layer.

16. The light-emitting device according to claim 13, wherein the anti-adhesion layer has a surface below the side surface and the plurality of electrical contacts are protruded from the surface.

17. The light-emitting device according to claim 1, wherein the anti-adhesion layer has a surface substantially coplanar with the bottom surface.

18. The light-emitting device according to claim 1, wherein the anti-adhesion layer has a rough surface.

19. The light-emitting device according to claim 1, wherein the cover layer laterally covers the side surface, and has a portion devoid of the anti-adhesion layer.

* * * * *